(12) United States Patent
Kanda

(10) Patent No.: US 8,253,445 B2
(45) Date of Patent: Aug. 28, 2012

(54) OUTPUT CIRCUIT HAVING PRE-EMPHASIS FUNCTION

(75) Inventor: Tsuyoshi Kanda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 209 days.

(21) Appl. No.: 12/801,213

(22) Filed: May 27, 2010

(65) Prior Publication Data
US 2010/0301905 A1 Dec. 2, 2010

(30) Foreign Application Priority Data

Jun. 2, 2009 (JP) ................................ 2009-133225

(51) Int. Cl.
*H03B 1/00* (2006.01)
(52) U.S. Cl. .......................... 327/108; 327/112; 326/83
(58) Field of Classification Search .................... 327/108
See application file for complete search history.

(56) References Cited

U.S. PATENT DOCUMENTS

| | | | | |
|---|---|---|---|---|
| 6,977,534 | B2 * | 12/2005 | Radelinow | 327/112 |
| 7,348,794 | B2 * | 3/2008 | Tanaka | 326/26 |
| 7,443,204 | B2 * | 10/2008 | Phang et al. | 326/87 |
| 7,659,747 | B2 * | 2/2010 | Shiraishi et al. | 326/83 |
| 7,863,936 | B1 * | 1/2011 | Liu et al. | 326/86 |
| 2004/0232945 | A1 | 11/2004 | Tseng | |
| 2008/0001630 | A1 | 1/2008 | Phang et al. | |

FOREIGN PATENT DOCUMENTS

JP 2004-350272 12/2004

* cited by examiner

*Primary Examiner* — Hai L Nguyen
(74) *Attorney, Agent, or Firm* — McGinn IP Law Group, PLLC

(57) ABSTRACT

An output circuit includes a first differential pair of transistors driven by a first current source and differentially receiving input signals and a second differential pair of transistors driven by a second current source and differentially receiving first control signals (EMT, EMB). Output pairs of the first and second differential pairs are connected to the differential output terminals. A load resistor element pair is connected between a power supply and the differential output terminals. The output circuit further includes a third differential pair of transistors driven by a third current source and differentially receiving second control signals and a fourth differential pair of transistors driven by a fourth current source and differentially receiving third control signals. An output pair of the third differential pair of transistors is connected between one of the differential output terminals and the power supply. An output pair of the fourth differential pair of transistors is connected between the power supply and the other of the differential output terminals.

20 Claims, 11 Drawing Sheets

FIG. 11
REFERENCE CASE

| AC common mode | Vcmac | |
|---|---|---|
| Spec | max | unit |
| PCIe rev2.1(2.5G) | 20 | mVrms |
| PCIe rev2.1(5G) | 100 | mVpp |
| USB3.0(5G) | 100 | mVpp |
| CEI-6G-SR | 40 | mVpp |
| CEI-6G-LR | 40 | mVpp |
| SATA gen1(1.5G) | 50 | mVpp |
| SATA gen2(3G) | 50 | mVpp |

…

OUTPUT CIRCUIT HAVING PRE-EMPHASIS FUNCTION

CROSS-REFERENCE TO RELATED APPLICATION

This application is based upon and claims the benefit of the priority of Japanese patent application No. 2009-133225 filed on Jun. 2, 2009, the disclosure of which is incorporated herein in its entirety by reference thereto.

TECHNICAL FIELD

The present invention relates to an output circuit having a pre-emphasis function.

BACKGROUND

In a differential output circuit in which a signal of an integrated circuit is transmitted to another integrated circuit through a differential transmission line, it is a common practice to apply pre-emphasis with a loss of the transmission line took into account and to transmit the pre-emphasized signal. In the output circuit having a pre-emphasis function, the pre-emphasis is applied when current bit data to be output is changed from immediately preceding output bit data. When the current bit data does not change from the immediately preceding output bit data, the pre-emphasis is not applied.

In the differential output circuit having the pre-emphasis function, there may be a difference in a common mode voltage (VCM) between a transition bit and a de-emphasis bit (De-emphasis bit). The common mode voltage (VCM) is a center voltage of differential output signals. The transition bit is a bit which has transitioned from the value of the immediately preceding bit data and to which the pre-emphasis has been applied. The de-emphasis bit is a bit to which the pre-emphasis has not been applied. When the common mode voltage (VCM) greatly varies between the transition bit and the de-emphasis bit, non-conformity with specifications of a standard interface such as PCI-Express/Serial-ATA/CEI may occur. FIG. 11 shows an example of specifications for an AC common mode voltage (Vcmac: AC coupled common mode voltage) of the standard interface specifications. In the output circuit conforming to these standard interface specifications, operation with a low supply voltage is demanded so as to achieve low power consumption. When a large differential output amplitude (greater than or equal to 800 mV and less than or equal to 1200 mV) of the PCI-Express interface is to be achieved with the low supply voltage, the common mode voltage (VCM) tends to greatly vary due to the difference of the common mode voltage (VCM) between the transition bit and the de-emphasis bit. For this reason, the need for reduction or suppression of the variation of the common mode voltage (VCM) increases. Related arts of an output circuit having the pre-emphasis function (without a function of suppressing the variation of the VCM) and an output circuit having the function of suppressing the variation of the VCM will be described below.

FIG. 6 is a diagram showing a configuration of the output circuit having the pre-emphasis function (refer to Patent Document 1). Referring to FIG. 6, the output circuit includes a driver main buffer 10 and a pre-emphasis buffer 20. The driver main buffer 10 includes an NMOS transistor (current source transistor) N11 which has a source connected to a low-potential side power supply VSS, NMOS transistors N1 and N2 which have coupled sources connected to a drain of the current source transistor N11, have gates connected to differential input terminals INT and INB, respectively, and have drains connected to differential output terminals OUTB (also referred to as an negative-phase output terminal or an inverting output terminal) and OUTT (also referred to as a positive-phase output terminal or a non-inverting output terminal), respectively, and resistors R1 and R2 respectively connected between a high-potential side power supply VDD and the differential output terminals OUTB and OUTT (or the drains of the NMOS transistors N1 and N2). The NMOS transistor N11 has a gate supplied with a bias voltage BIAS.

The pre-emphasis buffer 20 includes an NMOS transistor (current source transistor) N12 has a source connected to the low-potential side power supply VSS and NMOS transistors N3 and N4 which have coupled sources connected to a drain of the current source transistor N12, have gates respectively connected to terminals EMT and EMB that differentially receive control signals (emphasis signals), and have drains respectively connected to the differential output terminals OUTB and OUTT. The NMOS transistor N12 has a gate supplied with the bias voltage BIAS. Reference characters T and B at the end of the name of a terminal or a signal such as OUTT, OUTB, EMT, EMB, and the like respectively indicate a positive phase (True) and a negative phase (Bar).

FIG. 7 is a timing chart for explaining the operation of the circuit in FIG. 6. The timing chart in FIG. 7 is newly prepared by the inventor of this application in order to explain the operation of the circuit in FIG. 6. FIG. 7 shows voltage waveforms of the terminals INT and INB, the terminals EMT and EMB, the terminal OUTB, a common mode voltage (VCM), the terminal OUTT, a drain node VS2 of the NMOS transistor N12 and a drain node VS1 of the NMOS transistor N11, and ON/OFF states of the NMOS transistors N1, N2, N3, and N4. Referring to FIG. 7, reference numerals (1) to (11) above the terminal INT respectively indicate timing periods. Details of the operation of the circuit in FIG. 6 will be described with reference to the timing chart in FIG. 7. In the following description, the name of a terminal may be commonly used as a signal name at the terminal.

<Period (1)>

The terminals (INT, INB) respectively transition to (High, Low) from (Low, High) levels immediately before the beginning of the timing chart. The terminals (EMT, EMB) are respectively kept (High, Low). In this period, the NMOS transistor N1 is turned ON, and the MOS transistor N2 is turned OFF. The NMOS transistor N3 is kept ON, and the NMOS transistor N4 is kept OFF. Then, differential output signals OUTT and OUTB assume a pre-emphasized High level (VOHP) and a pre-emphasized Low level (VOLP), respectively. The Low level of the output (VOLP: Voltage Output Low Pre-emphasized) in this case is low, and a voltage at a drain node VS1 of the current source transistor N11 and a voltage at a drain node VS2 of the current source transistor N12 are also low. That is, when signals (complementary signals) supplied to the differential input terminals (INT, INB) of the output circuit respectively change from (Low, High) to (High, Low), the terminals (EMT, EMB) are respectively set to (High, Low). Then, the terminals (OUTT, OUTB) are respectively set to the levels (VOHP, VOLP).

<Period (2)>

The terminals (INT, INB) are respectively kept (High, Low). The terminals (EMT, EMB) are respectively set to (Low, High). When the signals (complementary signals) supplied to the differential input terminals (INT, INB) of the output circuit are unchanged and remain (High, Low), the terminals (EMT, EMB) are respectively set to (Low, High). The output terminals OUTT and OUTB are respectively set to a level lower than an output voltage VOHP and a level higher than the output voltage VOLP, or de-emphasized levels. In the period (2), the NMOS transistor N1 is kept ON. However, the NMOS transistor N3 is turned OFF, and the NMOS transistor N4 is turned ON. The differential output signals (OUTT, OUTB) have de-emphasized waveforms. A Low potential of the output signal OUTB in the period (2) becomes higher than the voltage VOLP in the period (1) in which the NMOS transistors N1 and N3 are both turned on, because the NMOS transistor N3 is turned OFF in the period (2). A High potential of the output signal OUTT in the period (2) becomes lower than the voltage VOHP in the period (1) in which the NMOS transistors N2 and N4 are both turned off, because the NMOS transistor N4 is turned ON in the period (2). That is, at the pre-emphasis buffer 20, while the NMOS transistor N3 connected to the output terminal OUTB that outputs the Low output level VOLP is turned ON in the period (1), the NMOS transistor N4 connected to the output terminal OUTT that outputs the output level VOHP is turned ON in the period (2). For this reason, a level of the drain voltage VS2 at the current source transistor N12 rises from Va to Vb.

FIG. 8 shows a characteristic of a drain-to-source voltage Vds of the current source transistor N12 (plotted on an x axis) and a drain current Id (plotted on a y axis) in the pre-emphasis buffer of the circuit in FIG. 6. It can be seen from the Vds-Id characteristic in FIG. 8 that the drain current Id of the NMOS transistor N12 increases from Ia to Ib by an amount dI due to a rise of the voltage at the drain node VS2 of the current source transistor N12 from Va to Vb. For this reason, the common mode voltage (VCM) in the period (2) is lowered below the common mode voltage (VCM) in the period (1).

<Period (3)>

The terminals (INT, INB) are respectively set to (Low, High). The terminals (EMT, EMB) are respectively kept (Low, High). Since the terminal INT transitions from High to Low, pre-emphasis is performed with the terminal EMB kept High and the NMOS transistor N4 kept ON and with the terminal EMT kept Low and the NMOS transistor N3 kept OFF. Values at the terminals (EMT, EMB) are set to be the same as those in the period (2). The NMOS transistor N2 is turned ON, and the NMOS transistor N4 is kept ON. The NMOS transistor N1 is turned OFF, and the NMOS transistor N3 is kept OFF. Then, the differential output terminals OUTT and OUTB respectively assume the levels VOLP and VOHP, which are the pre-emphasized Low level and the pre-emphasized High level. The drain voltage VS1 of the current source transistor N11 and the drain voltage VS2 of the current source transistor N12 also are lowered.

<Period (4)>

The terminals (INT, INB) are respectively kept (Low, High). The terminals (EMT, EMB) are respectively set to (High, Low). The values at the terminals (EMT, EMB) are reversed from the states in the period (3). Thus, the NMOS transistor N4 is turned OFF, and the NMOS transistor N3 is turned ON. Then, the differential output terminals OUTT and OUTB assume the de-emphasized levels.

At the pre-emphasis buffer 20, while the NMOS transistor N4 connected to the output terminal OUTT that outputs the pre-emphasized Low level VOLP was ON in the period (3r), the NMOS transistor N3 connected to the output terminal OUTB that has output the pre-emphasized High level VOHD in the period (3) is turned ON in the period (4). For this reason, the voltage level of the drain node VS2 of the current source transistor N12 rises from Va to Vb. For the same reason as in the period (2), the drain current of the current source transistor N12 increases by the amount dI. The common mode voltage (VCM) in the period (4) is below the common mode voltage in the period (3).

<Periods (5) to (11)>

The operation which is one of the period (1) to the period (4) is repeated in the periods (5) to (11) as well.

The configuration of a logic circuit that generate, from input signals INT and INB, signals EMT and EMB which controls the pre-emphasis is well known. Various types of implementation are possible. Depending on a current bit supplied to the terminal INT and the immediately preceding bit of the current bit (held in a flip-flop), the signal EMT assumes one of the following states, for example:

if (current bit, immediately preceding bit)=(High, Low), the signal EMT is High, if (current bit, immediately preceding bit)=(High, High), the signal EMT is Low, if (current bit, immediately preceding bit)=(Low, High), the signal EMT is Low, and if (current bit, immediately preceding bit)=(Low, Low), the signal EMT is High.

The signal EMB is the complementary signal of the signal EMT.

The output circuit shown in FIG. 6 does not have the function of suppressing the variation of the common mode voltage VCM. Thus, the common mode voltage (VCM) may differ between the transition bit and the de-emphasis bit. The variation of the common mode voltage VCM may increase (deteriorate). That is, without modification of the specifications such as increase of supply voltage and reduction of output amplitude, nonconformity with the specifications of the standard interface (PCI-Express/Serial-ATA/CEI) may occur. The specification for the variation of the AC common mode voltage (Vcmac) is, for example, 50 mVpp in SATA (Serial-Advanced Technology Attachment), as shown in FIG. 11.

In the output circuit conforming to the standard interface specifications, operation with the low supply voltage is demanded in order to achieve low power consumption. When the large differential output amplitude (greater than or equal to 800 mV and less than or equal to 1200 mV) of the PCI-Express interface is to be implemented with the low supply voltage in the circuit in FIG. 6, the variation of the common mode voltage (VCM) between the transition bit and the de-emphasis bit increases. When the variation of the common mode voltage VCM increases, a delay at input of a receiver circuit (differential receiver circuit) that receives the differential signals from the differential output terminals OUTT and OUTB varies. This delay variation becomes a jitter. The time interval during which the receiver circuit can receive the differential signals is reduced, thereby deteriorating jitter tolerance.

FIG. 9 is a diagram showing a configuration of a common circuit that stabilizes the common mode voltage VCM using a feedback circuit. Referring to FIG. 9, the circuit includes a driver main buffer 10', a pre-emphasis buffer 20', and a VCM feedback unit 21. The driver main buffer 10' includes a PMOS transistor P1 provided between a high-potential side power supply VDD and a common connection node of one ends of load resistor elements R1 and R2 having other ends connected to drains of NMOS transistors N1 and N2. The VCM feedback unit 21 includes an operational amplifier (OPAMP) in which a center voltage COM between output terminals OUT and OUTB (voltage at a connection node of resistors R3 and R4 provided between the output terminals OUTT and OUTB) in the pre-emphasis driver 20' is supplied to a non-inverting input, a common mode reference voltage (VCMREF) is supplied to an inverting input, and an output is connected to a gate of the PMOS transistor P1. The operational amplifier (OPAMP) controls a gate voltage of the PMOS transistor P1 and adjusts a drain voltage VD1 (voltage at a connection node of the load resistor elements R1 and R2) of the PMOS transistor P1 so that the center voltage (common mode voltage) (COM) matches with the voltage VCMREF. Feedback is thereby applied to the common mode voltage (COM). A tracking speed of the circuit in this method of stabilizing the common mode voltage VCM depends on a tracking speed of the feedback circuit including the operational amplifier (OPAMP) and the PMOS transistor P1. For this reason, the circuit in FIG. 9 is effective for the variation of the common mode voltage VCM of the order of not more than several dozen MHz. However, the circuit in FIG. 9 cannot track the variation of the common mode voltage VCM at high speed exceeding 1 GHz such as the variation of the VCM between the transition bit and the de-emphasis bit in the standard interface such as PCI-Express/Serial-ATA/CEI. The circuit in FIG. 9 cannot accommodate the high-speed variation of the common mode voltage VCM.

As shown in FIG. 4 of Patent Document 1, two PMOS transistors having drains respectively connected to the drains of the NMOS transistors N3 and N4 in the pre-emphasis buffer of the circuit in FIG. 6 are provided. Then, a third PMOS transistor is provided between coupled sources of these two PMOS transistors and a power supply VDD to compensate for a common mode variation of a de-emphasis bit. In this case, four transistors are cascoded, which is not suited to a low supply voltage. Further, the PMOS transistors are connected in parallel with the resistors R1 and R2. Thus, an output DC impedance decreases.

FIG. 10 shows a configuration of an output circuit (current mode logic driver) disclosed in Patent Document 2. FIG. 10 has been prepared, based on a configuration in FIG. 5 of Patent Document 2. Referring to FIG. 10, a driver main buffer 10 and a pre-emphasis buffer 20 are the same as those in the configuration in FIG. 6. As shown in FIG. 10, the output circuit includes a level shift mechanism. The level shift mechanism includes a current source Ipu of a VCM pull-up mechanism between a high-potential side power supply VDD and an output terminal OUTT, and a current source Ipd of a VCM pull-down mechanism between the output terminal OUTT and a low-potential side power supply VSS. The level shift mechanism includes a current source Ipu of the VCM pull-up mechanism between the high-potential side power supply VDD and an output terminal OUTB, and a current source Ipd of the VCM pull-down mechanism between the output terminal OUTB and the low-potential side power supply VSS. A resistor R3 connected between the differential output terminals OUTT and OUTB of the output circuit is a load resistor.

In the following description, it is assumed that the pre-emphasis buffer 20 is in a non-operation state (accordingly, NMOS transistors N3 and N4 are both turned OFF). It is also assumed that an NMOS transistor N1 is turned ON, and an NMOS transistor N2 is turned OFF. There are two sets of current paths I1 and I2 in the circuit, and a value of current of each current path is determined by a ratio among resistor elements R1 and R2 and the resistor element R3. In this case, the output terminal OUTT outputs a High level (VOH). This level is given by:

$$VOH = VDD - I2 \times R2$$

On the other hand, the output terminal OUTB outputs a Low level (VOL). This level is given by:

$$VOL = VDD - I1 \times R1$$

A common mode voltage (VCM) is expressed by:

$$VCM = (VOH + VOL)/2$$
$$= VDD - (I1 \times R1 + I2 \times R2)/2$$

When the common mode voltage (VCM) is to be increased, the two constant current sources Ipu of the VCM pull-up mechanism connected between the differential output terminals (OUTT, OUTB) and the power supply VDD are both turned ON, and the two constant current sources Ipd of the VCM pull-down mechanism connected, between the differential output terminals (OUTT, OUTB) and the GND (VSS) are turned OFF.

In this case, the output High level is given by:

$$VOH = VDD - (I2 - Ipu) \times R2,$$

and the output Low level is given by:

$$VOL = VDD - (I1 - Ipu) \times R1$$

The common mode voltage (VCM) is given by:

$$VCM = (VOH + VOL)/2$$
$$= VDD - (I1 \times R1 + I2 \times R2)/2 + Ipu \times (R1 + R2)/2.$$

Then, the potential of the VCM increases by an amount of Ipu×(R1+R2)/2.

When the common mode voltage (VCM) is to be lowered, the two constant current sources Ipu of the VCM pull-up mechanism connected between the differential output terminals (OUTT, OUTB) and the power supply VDD are both turned OFF, and the two constant current sources Ipd of the VCM pull-down mechanism connected between the differential output terminals (OUTT, OUTB) and the GND (VSS) are turned ON. In this case, the output High level is given by:

$$VOH = VDD - (I2 + Ipd) \times R2,$$

and the output Low level is given by:

$$VOL = VDD - (I1 + Ipd) \times R1$$

The common mode voltage (VCM) is given by:

$$VCM = (VOH + VOL)/2$$
$$= VDD - (I1 \times R1 + I2 \times R2)/2 - Ipd \times (R1 + R2)/2.$$

Then, the potential of the VCM decreases by an amount of Ipd×(R1+R2)/2.

By controlling current values of the constant current sources Ipu of the VCM pull-up mechanism connected between the output terminals (OUTT, OUTB) and the power supply (VDD) and current values of the constant current sources Ipd of the VCM pull-down mechanism connected between the output terminals (OUTT, OUTB) and the GND (VSS) in this manner, the common mode voltage VCM can be adjusted.

[Patent Document 1] US2008/0001630A1
[Patent Document 2] JP Patent Kokai Publication No. JP-P-2004-350272A

SUMMARY

The above Patent Documents are incorporated herein by reference thereto. Analyses of the related arts by the present invention will be given below.

In the circuit shown in FIG. 10, the common mode voltages (VCMs) of both of the output waveform of the pre-emphasized transition bit and the output waveform of the de-emphasis bit are adjusted. In the output circuit shown in FIG. 10, PMOS transistors that constitute the two constant current sources Ipu of the VCM pull-up mechanism and constant current source transistors of the VCM pull-down mechanism are respectively connected to the differential outputs OUTT and OUTB. In case the power supply voltage VDD is reduced in order to reduce power consumption, there is a limit just by simply increasing the common mode voltage (VCM) as in the configuration in FIG. 10. The deviation of the common mode voltage (VCM) between the transition bit and the de-emphasis bit is not eliminated. For this reason, a function capable of adjusting the common mode voltage (VCM) for the de-emphasis bit alone is needed (the above descriptions are result of the analyses by the inventor of the present invention).

Ideally, a constant current source transistor has an infinite output impedance. However, actually, the impedance of the constant current source transistor decreases. If a power supply voltage is further reduced, it is difficult to keep a high impedance. When output impedances of the constant current sources connected to the output terminals OUTT and OUTB decrease, an impedance of the output circuit decreases. Accordingly, non-conformity with the specifications of the standard interface (PCI-Express/Serial-ATA/CEI) may occur.

Further, in the circuit in FIG. 10, the constant current sources are connected to each of the output terminals OUTT and OUTB. Then, a large diffusion layer capacitance is attached to each of the output terminals OUTT and OUTB. A high-speed operation cannot be accommodated.

The present invention may be summarized as follows, although not limited thereto.

According to the present invention, there is provided an output circuit that differentially receives input signals for differential output, and applies pre-emphasis to differential output signals at a time of transitions of the input signals. The output circuit comprises a differential circuit that reinforces a pre-emphasis operation on the differential output signals at a time of the pre-emphasis, and turns off a path through which the pre-emphasis has been reinforced on the differential output signals and turns on a path between first and second power supplies at a time of de-emphasis.

According to the present invention, there is provided an output circuit comprising: first and second input terminals; first and second output terminals; a first current source connected to a second power supply; a first differential transistor pair driven by the first current source, the first differential transistor pair having an input pair connected to the first and second input terminals and having an output pair connected to the first and second output terminals; a load resistor element pair connected between the first and second output terminals and a first power supply; a second current source connected to the second power supply; a second differential transistor pair driven by the second current source, the second differential transistor pair differentially receiving first control signals, the second differential transistor pair having an output pair connected to the first and second output terminals; a third current source connected to the second power supply; a third differential transistor pair driven by the third current source, the third differential transistor pair differentially receiving second control signals, the third differential transistor pair having an output pair connected to the second output terminal and the first power supply; a fourth current source connected to the second power supply; and a fourth differential transistor pair driven by the fourth current source, the fourth differential transistor pair differentially receiving third control signals, the fourth differential transistor pair having an output pair connected to the first power supply and the first output terminal. According to the present invention, there is provided a semiconductor device comprising the output circuit.

According to the present invention, it becomes possible to suppress a variation of a common mode voltage of the differential output signals at times of pre-emphasis and de-emphasis. The present invention can track the variation of the common mode voltage at high speed.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

FIG. 11 is a table showing an example of specifications for AC common mode voltages of standard interface specifications.

PREFERRED MODES

An exemplary embodiment of the present invention will be described below. An output circuit according to one of modes of the present invention, includes a first differential pair of transistors (N1, N2) that are driven by a first current source (N11) connected to a VSS (second power supply), differentially receive input signals (INT, INB), and have outputs connected to first and second output terminals (differential output terminals) (OUTB, OUTT);

a second differential pair of transistors (N3, N4) that are driven by a second current source (N12) connected to a VSS (second power supply), differentially receive first control signals (EMT, EMB) and have outputs connected to the first and second output terminals (differential output terminals) (OUTB, OUTT); and first and second load resistors (R1, R2) connected between the first and second output terminals (OUTB, OUTT) and a power supply (first power supply) (VDD). The output circuit further comprises a de-emphasis level control buffer (30) that comprises:

a third differential pair of transistors (N5, N6) that are driven by a third current source (N13), differentially receive second control signals (DET, OFT), and have outputs connected to one output terminal of the differential output terminals (second output terminal) (OUTT) and the power supply (VDD); and a fourth differential pair of transistors (N7, N8) that are driven by a fourth current source (N14), differentially receive third control signals (OFB, DEB) and have outputs connected to the power supply (VDD) and the other output terminal of of the differential output terminals (first output terminal) (OUTB).

In the differential output circuit of the present invention for transmitting a signal of an integrated circuit (semiconductor device) to another integrated circuit (semiconductor device) through a transmission line, a variation of a common mode voltage (VCM) of differential output signals at a time of de-emphasis is compensated for, thereby improving deterioration of the variation of the common mode voltage. When the output circuit is configured using a low power supply voltage and a large amplitude is output, imbalance between pre-emphasized waveforms of a High-level output and a Low-level output, or a variation of the common mode voltage (VCM) between a pre-emphasized transition bit and a de-emphasized bit that is not pre-emphasized is improved and adjusted. A description will be given below in connection with exemplary embodiments.

Figure 1:
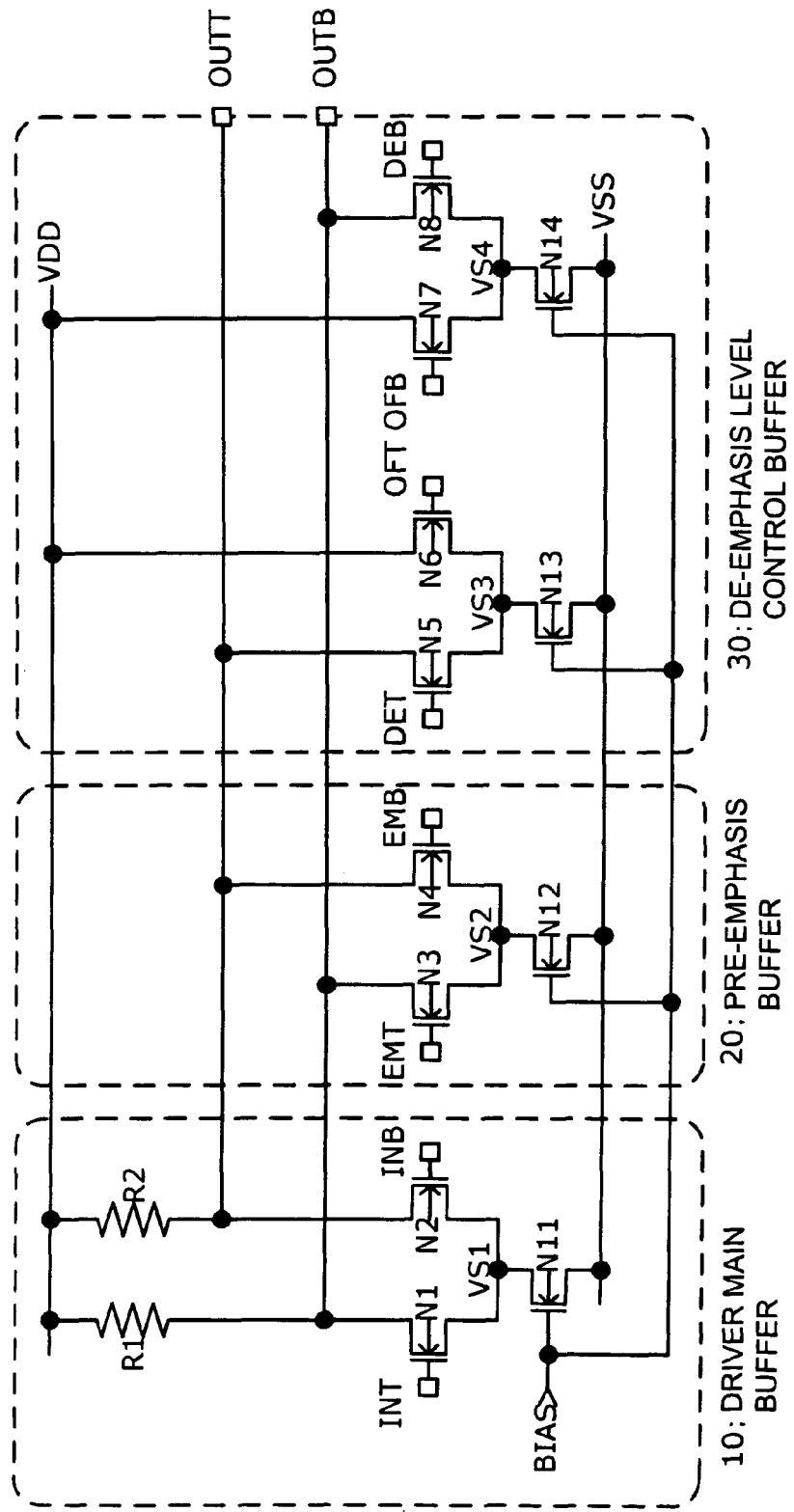
FIG. 1 is a diagram showing a configuration of an example of the present invention.

FIG. 1 is a diagram showing a configuration of an exemplary embodiment of the present invention. Referring to FIG. 1, this output circuit includes a driver main buffer 10, a pre-emphasis buffer 20, and a de-emphasis control buffer 30.

The driver main buffer 10 includes an NMOS transistor (current source transistor) N11 having a source thereof connected to a low-potential side power supply VSS, NMOS transistors N1 and N2 (first differential transistor pair) having coupled sources thereof connected to a drain of the current source transistor N11, gates thereof respectively connected to differential input terminals INT and INB, and drains thereof respectively connected to differential output terminals OUTB and OUTT, a load resistor element R1 connected between a drain of the NMOS transistor N1 and a high-potential side power supply VDD, and a load resistor element R2 connected between a drain of the NMOS transistor N2 and the high-potential side power supply VDD. The NMOS transistor N11 receives a bias voltage BIAS at a gate thereof.

The pre-emphasis buffer 20 includes an NMOS transistor (current source transistor) N12 having a source thereof connected to the low-potential side power supply VSS and NMOS transistors N3 and N4 (second differential transistor pair) having coupled sources connected to a drain of the current source transistor N12, gates thereof respectively connected to terminals EMT and EMB, and drains thereof respectively connected to the differential output terminals OUTB and OUTT. The NMOS transistor N12 receives the bias voltage BIAS at a gate thereof.

The de-emphasis level control buffer 30 includes an NMOS transistor (current source transistor) N13 having a source thereof connected to the low-potential side power supply VSS, NMOS transistors N5 and N6 (third differential transistor pair) having coupled sources connected to a drain of the current source transistor N13, gates thereof respectively connected to terminals DET and OFT, and drains thereof respectively connected to the output terminal OUTT and the power supply VDD, an NMOS transistor (current source transistor) N14 having a source thereof connected to the low-potential side power supply VSS, NMOS transistors N7 and N8 (fourth differential transistor pair) having coupled sources connected to a drain of the current source transistor N14, gates thereof respectively connected to terminals OFB and DEB, and drains thereof respectively connected to the power supply VDD and the output terminal OUTB. The NMOS transistor N13 receives the bias voltage BIAS at a gate thereof. The NMOS transistor N14 receives the bias voltage BIAS at a gate thereof. Control signals are supplied to the terminals DET and OFT connected to the gates of the third differential transistor pair (N5, N6). Control signals are supplied to the terminals OFB and DEB connected to the gates of the third differential transistor pair (N7, N8). DET and OFT are complementary each other. DFB and OFB are complementary each other.

Figure 6:
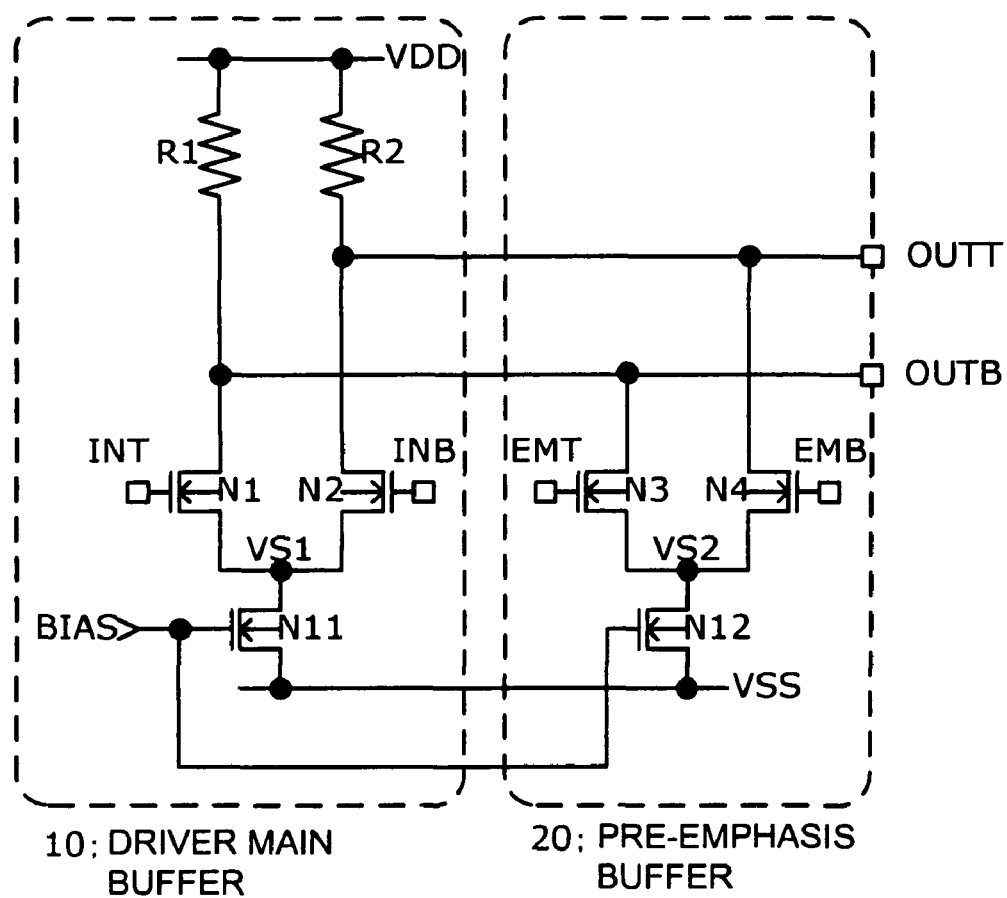
FIG. 6 is a diagram showing a configuration of a first related art.
Figure 7:
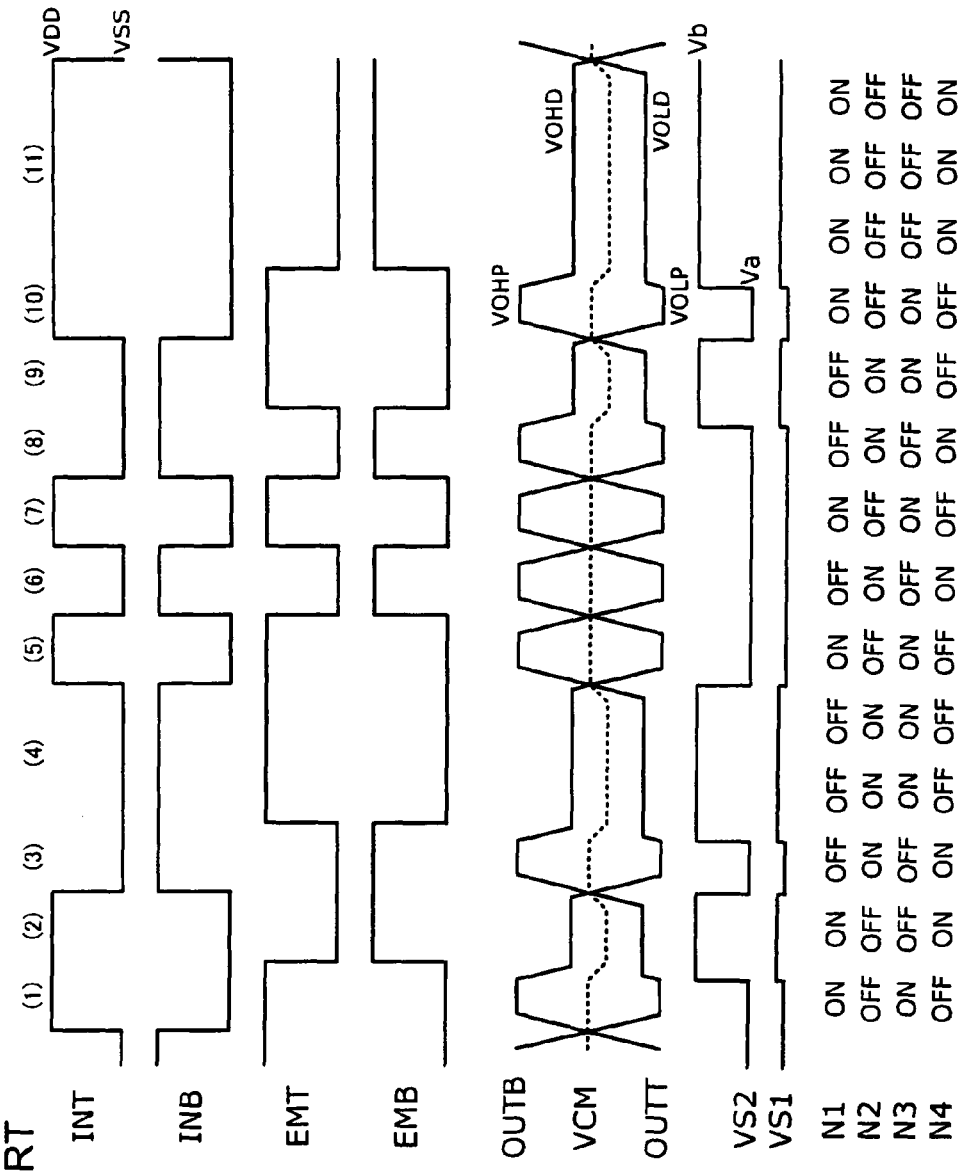
FIG. 7 is a timing chart explaining an operation of the first related art.
Figure 8:
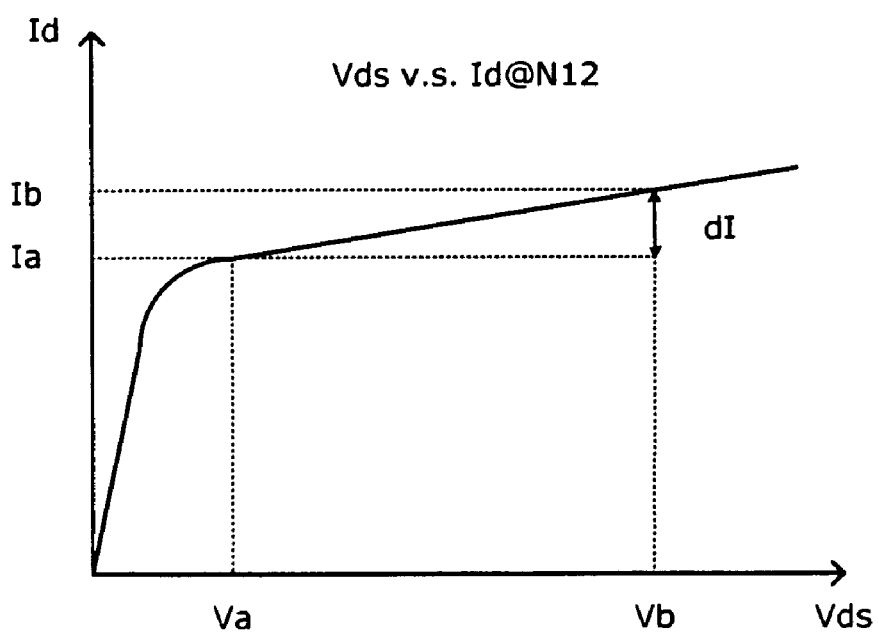
FIG. 8 is a graph showing a characteristic of a drain-to-source voltage (Vds) and a drain current (Id) of an MOS transistor.

When a large amplitude is output from the aforementioned output circuit of the related art that is configured using a low supply voltage, voltages at drain nodes (VS1, VS2) of current source transistors (N11, N12 in FIG. 6) decrease together with lowering of an output Low level. Then, as shown in FIG. 7, a voltage at the drain node VS2 of the constant current source transistor N12 of the pre-emphasis buffer (indicated by reference numeral 20 in FIG. 6) increases more greatly in the case of a de-emphasis bit (in a period (2), for example) than in the case of a transition bit (in a period (1), for example). Due to a voltage difference (Vb−Va) at the drain node VS2 of the constant current source transistor N12 of the pre-emphasis buffer (indicated by reference numeral 20 in FIG. 6) between times of de-emphasis and pre-emphasis, a current value of the current source transistor N12 of the pre-emphasis buffer (indicated by reference numeral 20 in FIG. 6) increases by an amount of a difference current (dI), as seen from a Vds−Id characteristic in FIG. 8. The common mode voltage (VCM) at a time of de-emphasis is thereby lowered from the common mode voltage (VCM) of the transition bit at a time of pre-emphasis. The variation of the common mode voltage (VCM) between the de-emphasis bit and pre-emphasis bit is therefore deteriorated.

On contrast therewith, in the de-emphasis level control buffer 30 including two differential pairs of the transistors (N5, N6) and (N7, N8) as shown in FIG. 1 in this embodiment, the current value is reduced only in the case of a de-emphasis bit so that the level of the common mode voltage (VCM) is raised. With this arrangement, a significant lowering of the common mode voltage (VCM) at a time of the de-emphasis from the common mode voltage (VCM) at a time of the transition bit at a time of pre-emphasis can be prevented.

Figure 3:
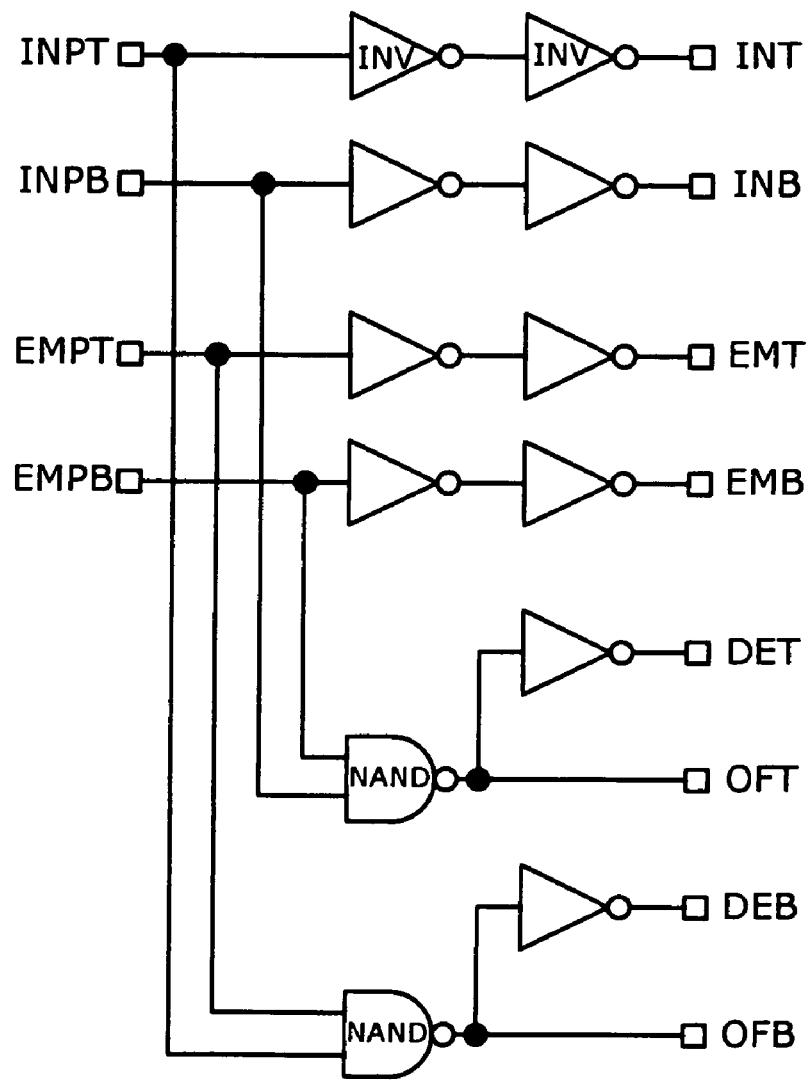
FIG. 3 is a diagram showing a configuration of logic circuits that generate control signals in the example of the present invention.

Control signals (DET, DEB, OFT, OFB) for reducing the current value in the case of the de-emphasis bit are generated from signals (INPT, INPB, EMPT, EMPB) by a circuit shown in FIG. 3. Signals INT, INB, EMT, and EMB are respectively output from the signals INPT, INPB, EMPT, and EMPB through two stages of inverters (INV) (which constitute a non-inverting buffer). The signal DET is a signal obtained by inverting an output of a two-input NAND circuit that receives the signals INPB and EMPB by an inverter. The signal OFT is an output of the NAND circuit. The signals DET and OFT are complementary signals. The signal DEB is a signal obtained by inverting an output of a two-input NAND circuit that receives the signals INPT and EMPT by an inverter. The signal OFB is an output of the NAND circuit. The signals DEB and OFB are complementary signals.

Figure 4:
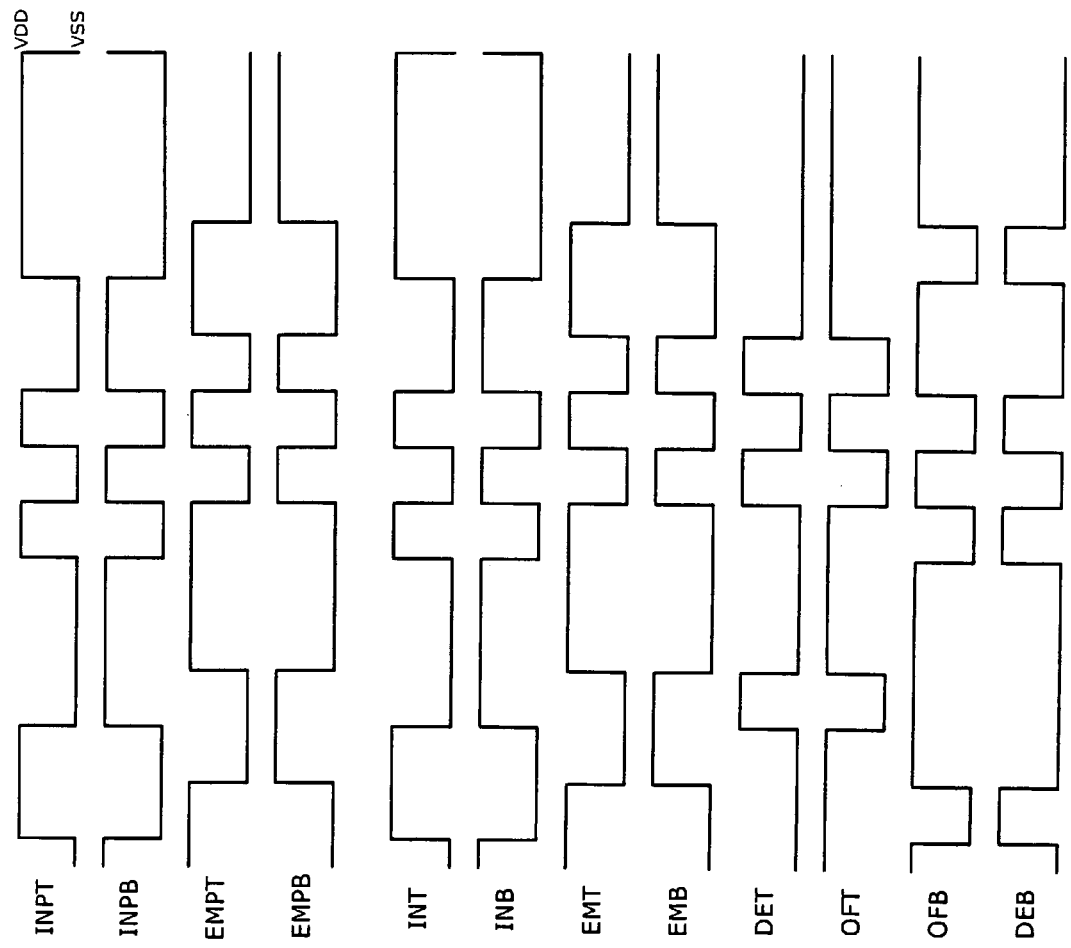
FIG. 4 is a timing diagram explaining operations of the logic circuits in FIG. 3.

As shown in FIG. 4, only when the signals (INPB, EMPB) are respectively (High, High), the signal OFT is Low, and the signal DET is High. When the signals (INPB, EMPB) respectively assume values other than values of (High, High) levels, the signal OFT is High, and the signal DET is Low. That is, at a time of the pre-emphasis (where the signal EMB is High) in which the signals (INT, INB) respectively transition to (Low, High) from (High, Low), the signal OFT goes Low and the signal DET goes High. The NMOS transistor N5 in FIG. 1 is thereby turned ON. Otherwise, the NMOS transistor N5 is set to be OFF, and the NMOS transistor N6 is set to be ON.

Only when the signals (INPT, EMPT) are respectively (High, High), the signal OFB is Low, and the signal DEB is High. When the signals (INPT, EMPT) respectively assume values other than values of (High, High) levels, the signal OFB is High, and the signal DEB is Low. That is, at a time of the pre-emphasis (where the signal EMT is High) in which the signals (INT, INB) respectively transition from (Low, High) to (High, Low), the signal OFB goes Low and the signal DEB goes High. The NMOS transistor N8 in FIG. 1 is thereby turned ON. Otherwise, the NMOS transistor N8 is set to be OFF, and the NMOS transistor N7 is set to be ON.

By changing W (gate width) sizes of the current source transistors N13 and N14 of the de-emphasis level control buffer 30, a common mode voltage (VCM) level of the de-emphasis bit can be adjusted. By increasing the sizes of the current source transistors N13 and N14, for example, an output current increases with respect to the bias voltage BIAS.

Figure 2:
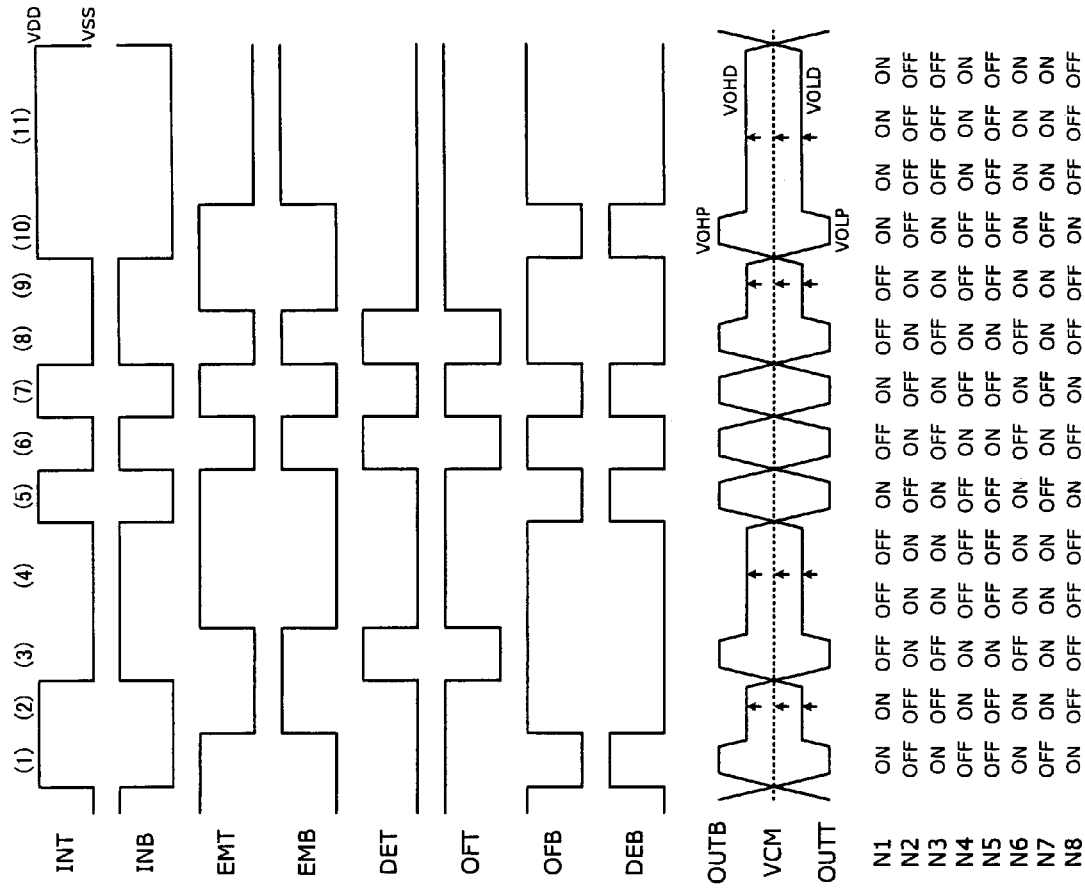
FIG. 2 is a timing diagram explaining an operation of the example of the present invention.

FIG. 2 is a timing chart for explaining an overall operation of this example described with reference to FIGS. 1, 3, and 4. FIG. 2 shows voltage waveforms at terminals INT, INB, EMT, EMB, DET, OFT, OFB, DEB, OUTB, and OUTT, a voltage waveform of the VCM (common mode voltage), and ON/OFF states of the NMOS transistors N1 to N8. Referring to FIG. 2, reference numerals (1) to (11) above the signal INT denote timing periods.

As described above, the signal OFT is Low (and the complementary signal DEB of the signal OFT is High) only when the signals (INB, EMB) are respectively (High, High). Only when the signals (INT, EMT) are respectively (High, High), the signal OFB is Low (and the complementary signal DEB of the signal OFB is High).

<Period (1)>

(INT, INB) respectively transition to (High, Low) from (Low, High), with (EMT, EMB)=(High, Low), (DET, OFT)= (Low, High) and (OFB, DEB)=(Low, High). In this period, the NMOS transistor N1 and N3 are ON and the NMOS transistor N2 and N4 OFF. Then, waveforms of differential outputs OUTT and OUTB are pre-emphasized. The output OUTT is set to High (VDD), and the output OUTB is set to Low (VSS). In this case, the NMOS transistor N8 is ON, and the NMOS transistor N5 is OFF so that the pre-emphasis operation is reinforced. The NMOS transistor N6 is ON, and the NMOS transistor N7 is OFF.

<Period (2)>

(INT, INB) are respectively kept (High, Low). (EMT, EMB) are respectively set to (Low, High). (DET, OFT) are respectively kept (Low, High). (OFB, DEB) are respectively set to (High, Low). In this period, the NMOS transistor N1 is kept ON. The NMOS transistor N3 is turned OFF so that the pre-emphasis is weakened. The NMOS transistor N2 is kept OFF. The NMOS transistor N4 is turned ON. Then, the waveforms of the differential outputs OUTT and OUTB are de-emphasized. The NMOS transistor N5 is kept OFF, and the NMOS transistor N8 is turned OFF. The drains of the NMOS transistors N6 and N7 are connected to the power supply VDD rather than the differential outputs OUTT and OUTB. Since the terminals OFT and OFB are High, the NMOS transistors N6 and N7 are both turned ON. Current is thereby flown to a power supply side. The value of the current that flows through the circuit at a time of the de-emphasis is thereby reduced. The lowering of the common mode voltage (VCM) is thereby suppressed.

<Period (3)>

(INT, INB) are respectively set to (Low, High). (EMT, EMB) are respectively kept (Low, High). (DET, OFT) are respectively set to (High, Low). (OFB, DEB) are respectively kept (High, Low). The NMOS transistor N2 is turned ON, and the NMOS transistor N4 is kept ON. The NMOS transistor N1 is turned OFF. The NMOS transistor N3 is kept OFF. Then, the waveforms of the differential outputs OUTT and OUTB are pre-emphasized. In this period, the NMOS transistor N5 is turned ON, and the NMOS transistor N8 is kept OFF so that the pre-emphasis operation is reinforced. The NMOS transistor N6 is turned OFF, and the NMOS transistor N7 is kept ON.

<Period (4)>

(INT, INB) are respectively kept (Low, High). (EMT, EMB) are respectively set to (High, Low). (DET, OFT) are respectively set to (Low, High). (OFB, DEB) are respectively kept (High, Low). The NMOS transistor N2 is kept ON, and the NMOS transistor N4 is turned OFF so that the pre-emphasis is weakened. The NMOS transistor N1 is kept OFF, and the NMOS transistor N3 is turned ON. Then, the waveforms of the differential outputs OUTT and OUTB are de-emphasized. In this period, the NMOS transistor N5 is turned OFF, and the NMOS transistor N8 is kept OFF. The drains of the NMOS transistors N6 and N7 are both connected to the power supply VDD. Since OFT and OFB are High, the NMOS transistor N6 is turned ON, and the NMOS transistor N7 is kept ON. The current is thereby flown to the power supply side. The value of the current that flows through the circuit at the time of the de-emphasis is thereby reduced. The lowering of the common mode voltage (VCM) is thereby suppressed.

<Periods (5) to (11)>

Operations, each of which corresponds to one of the periods (1) to (4) are repeated.

Assume that the sources of the NMOS transistors N5 and N8 are connected in common to the drain of the current source transistor N13 and the NMOS transistors N6 and N7 are removed, instead of disposing the NMOS transistors N5 and N6 that form the differential pair and the NMOS transistors N7 and N8 that form the differential pair. Then, gate voltages of the NMOS transistors N5 and N8 may be both set to Low and turned off at the time of the de-emphasis. In this case, the deviation of the common mode voltage (VCM), which is the problem of the related art described with reference to FIGS. 6 and 7, cannot be eliminated.

According to the present exemplary embodiment, the common mode voltage (VCM) level at the time of the de-emphasis is optimized so as to be equivalent to the level of the VCM in the case of the transition bit. The deviation of the VCM is thereby reduced. The output circuit can accommodate the specification for the VCM variation defined in the specifications of the standard interface (PCI-Express/Serial-ATA/CEI).

According to the present exemplary embodiment, the common mode voltage (VCM) level at the time of the de-emphasis can be externally adjusted. Thus, even if there is a difference of the VCM variation between design and the actual circuit, the VCM variation can be improved without performing design again.

In order to track the VCM variation at high speed between the transition bit and the de-emphasis bit in the high-speed standard interface (PCI-Express/Serial-ATA/CEI), it is necessary to be able to reduce the common mode voltage (VCM) variation at a speed that is the same as a speed of data output from the output circuit.

Figure 5:
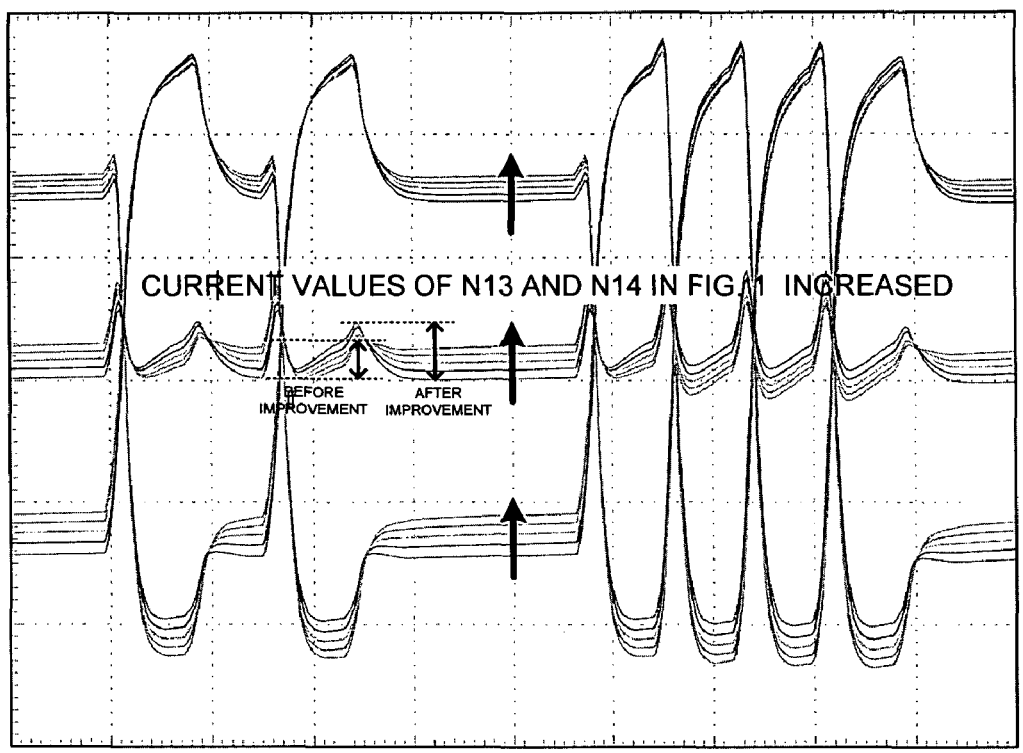
FIG. 5 is a diagram showing a result of simulation in the example of the present invention.

FIG. 5 is a diagram showing a result of simulation according to the embodiment. It can be seen that the common mode voltage (VCM) variation is suppressed between the transition bit and the de-emphasis bit at the time of the pre-emphasis. It can also be seen that, when current values of the current source transistors N13 and N14 in FIG. 1 are increased, the common mode voltage (VCM) of the de-emphasis bit is raised. The current source transistors N13 and N14 are configured to receive the bias voltage BIAS which is identical to that for the current source transistors N11 and N12. When the current values of the current source transistors N13 and N14 are increased in this configuration, the variation of the common mode voltage (VCM) is accommodated by setting the size (W/L: gate width/gate length) of each of the current source transistors N13 and N14 to be large, for example.

Figure 9:
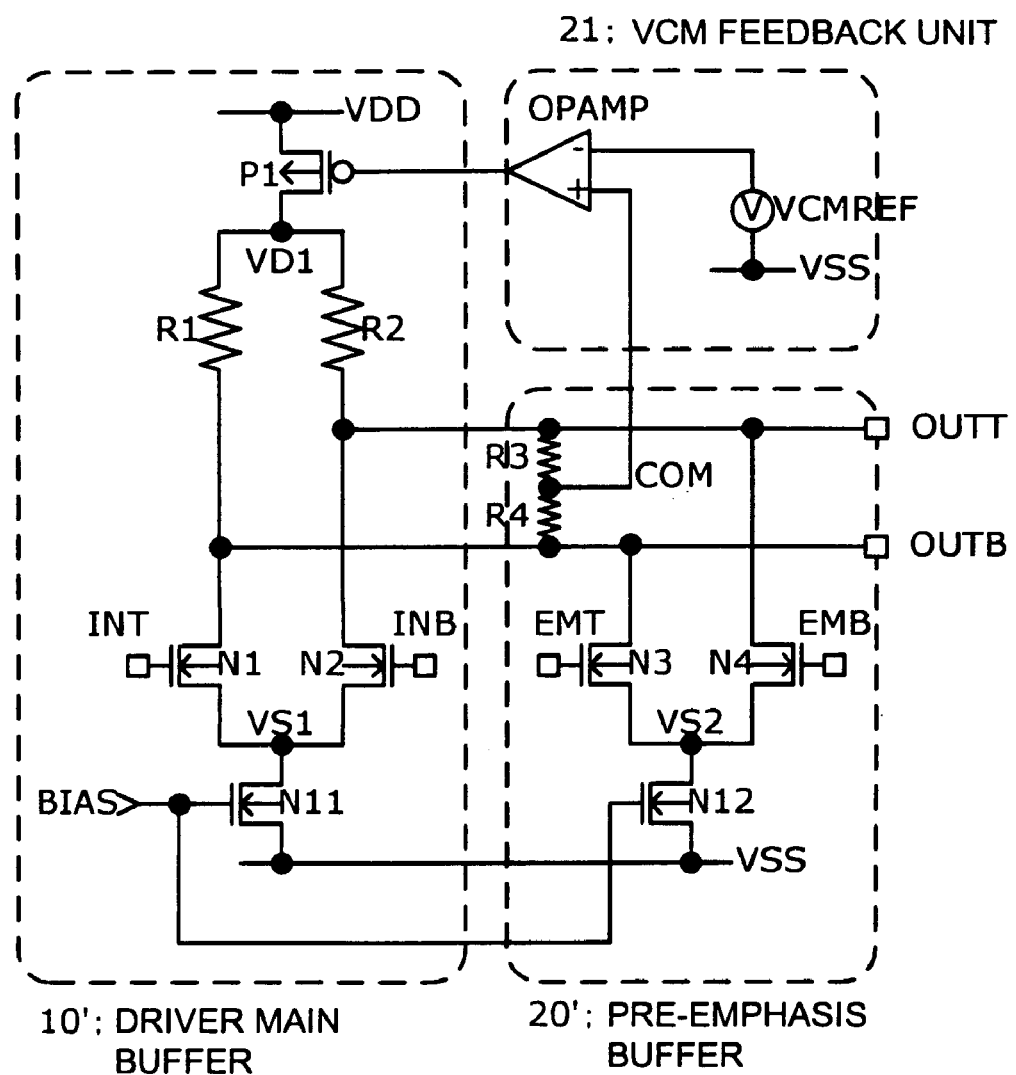
FIG. 9 is a diagram showing a configuration of a second related art.
Figure 10:
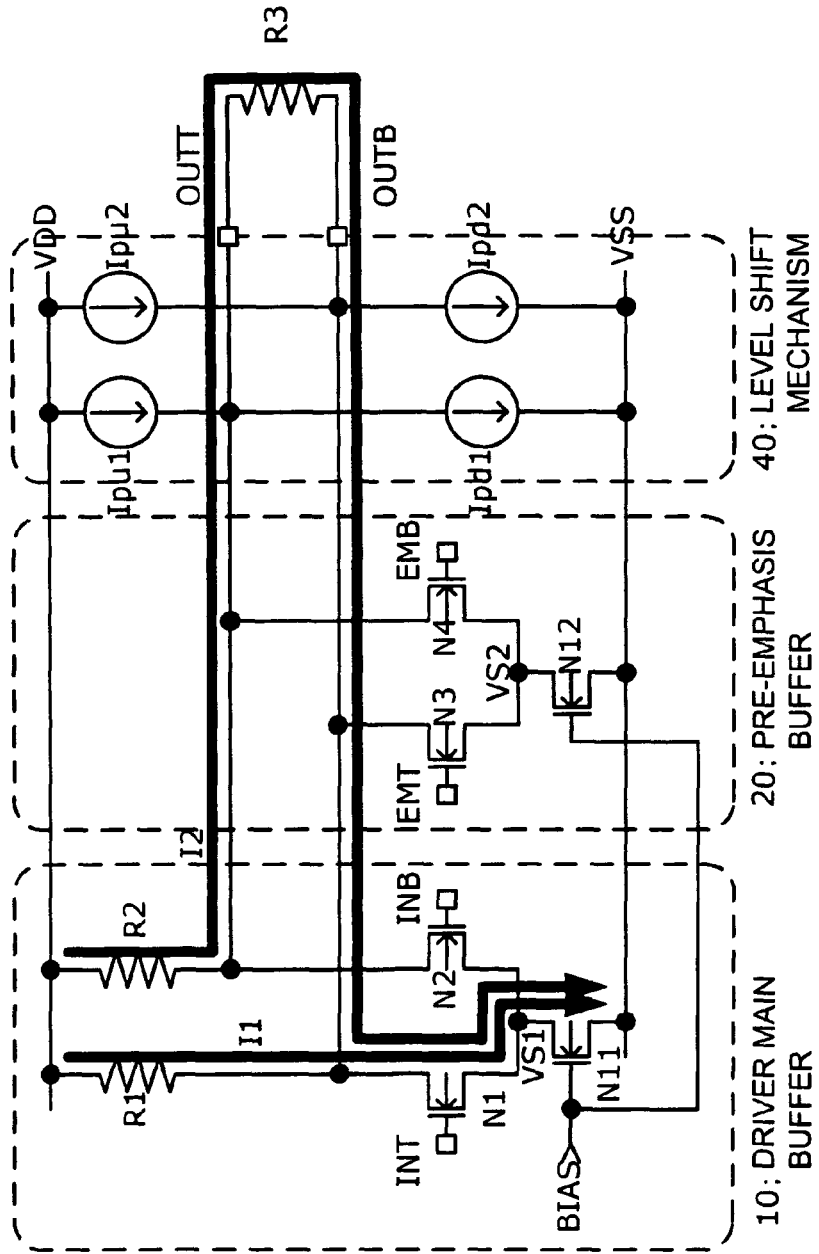
FIG. 10 is a diagram showing a configuration of a third related art.

In the configuration shown in FIG. 9, the VCM is stabilized by a feedback circuit (including an OPAMP) having a slow tracking speed. Contrary to this, in the present embodiment, there are prepared two differential pairs (N5, N6) and (N7, N8) which are operable at a speed that is the same as a transmission speed of output bit data. The output circuit according to the present embodiment can track the VCM variation at high speed.

The two differential pairs (N5, N6) and (N7, N8) operate to reduce the current only in case of the de-emphasis bit, due to control by the logic circuit in a preceding stage (refer to FIG. 3). By optimizing the VCM level of the de-emphasis bit so as to be comparable to the level of the VCM of the transition bit, a VCM variation value can be reduced. This effect is especially effective for an output circuit in which the common mode voltage (VCM) varies between the transition bit and the de-emphasis bit, as in case where a pre-emphasized waveform of a large amplitude has been output using a low supply voltage, for example.

In the example shown in FIG. 1, description was directed to the case where the differential pairs (N1, N2), (N3, N4), (N5, N6), and (N7, N8) were respectively formed of the NMOS transistors. The polarity of the differential pairs may be of course changed, and the differential pairs may be formed of PMOS transistors. In this case, the constant current source transistors N11, N12, N13, and N14 are formed of PMOS transistors. The load resistors R1 and R2 may be of course formed of active elements. The present invention is suitable for being applied to an output circuit that performs differential transmission between semiconductor devices, such as an output driver on the side of a serializer of a SerDes (serializer/deserializer) interface or the like which performs high-speed serial transmission.

Disclosures of Patent Documents listed above are incorporated herein by reference. Modifications and adjustments of the exemplary embodiment and the example are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. An output circuit comprising:
   first and second input terminals;
   first and second output terminals;
   a main buffer that receives differential input signals from the first and second input terminals and outputs differential output signals to the first and second output terminals;
   a pre-emphasis buffer that applies pre-emphasis to the differential output signals at a time of a transition of the differential input signals; and
   a de-emphasis-level control buffer including:
      a differential circuit that turns on a path between one of the first and second output terminals and one of first and second power supplies to reinforce the pre-emphasis operation on the differential output signals at a time of the pre-emphasis by the pre-emphasis buffer, and that, at a time of de-emphasis, turns off the path through which the pre-emphasis has been reinforced and turns on another path between the first and second power supplies,
   wherein the differential circuit includes two differential pairs of transistors having a current value reduced only during the time of de-emphasis.

2. A semiconductor device comprising the output circuit as set forth in claim 1.

3. The output circuit according to claim 1, wherein the differential circuit comprises the two differential pairs of transistors having the current value reduced only during the time of de-emphasis, such that a level of a common mode voltage is raised.

4. The output circuit according to claim 1, wherein the differential circuit comprises the two differential pairs of transistors operate to reduce the current value only with a de-emphasis bit providing the time of de-emphasis, such that a level of a common mode voltage of the de-emphasis bit is comparable to a level of a common mode voltage of a transition bit.

5. The output circuit according to claim 1, wherein the differential circuit comprises the two differential pairs of transistors operate to reduce the current value only with a de-emphasis bit providing the time of de-emphasis, such that a level of a common mode voltage of the de-emphasis bit is comparable to a level of a common mode voltage of a transition bit.

6. The output circuit according to claim 1, further comprising a logic circuit providing control signals for the differential circuit, such that the two differential pairs of transistors operate to reduce the current value only during the time of de-emphasis.

7. The output circuit according to claim 1, further comprising:
   first and second current sources connected to the second power supply,
   wherein the two pairs of differential transistors comprises:
      a first differential transistor pair driven by the first current source, the first differential transistor pair differentially receiving first control signals, the first differential transistor pair having an output pair connected to the second output terminal and the first power supply; and
      a second differential transistor pair driven by the second current source, the second differential transistor pair differentially receiving second control signals, the second differential transistor pair having an output pair connected to the first power supply and the first output terminal.

8. An output circuit comprising:
first and second input terminals;
first and second output terminals;
a main buffer that receives differential input signals from the first and second input terminals and outputs differential output signals to the first and second output terminals;
a pre-emphasis buffer that applies pre-emphasis to the differential output signals at a time of a transition of the differential input signals; and
a de-emphasis-level control buffer comprising:
a differential circuit that turns on a path between one of the first and second output terminals and one of first and second power supplies to reinforce the pre-emphasis operation on the differential output signals at a time of the pre-emphasis by the pre-emphasis buffer, and that, at a time of de-emphasis, turns off the path through which the pre-emphasis has been reinforced and turns on another path between the first and second power supplies, wherein the main buffer includes:
a first current source connected to the second power supply;
a first differential transistor pair driven by the first current source, the first differential transistor pair having an input pair connected to the first and second input terminals and having an output pair connected to the first and second output terminals; and
a load resistor element pair connected between the first and second output terminals and the first power supply;
wherein the pre-emphasis buffer includes:
a second current source connected to the second power supply; and
a second differential transistor pair driven by the second current source, the second differential transistor pair differentially receiving first control signals, the second differential transistor pair having an output pair connected to the first and second output terminals,
wherein the differential circuit of the de-emphasis-level control buffer includes:
a third current source connected to the second power supply;
a third differential transistor pair driven by the third current source, the third differential transistor pair differentially receiving second control signals, the third differential transistor pair having an output pair connected to the second output terminals and the first power supply; and
a fourth current source connected to the second power supply; and
a fourth differential transistor pair driven by the fourth current source, the fourth differential transistor pair differentially receiving third control signals, the fourth differential transistor pair having an output pair connected to the first power supply and the first output terminal.

9. The output circuit according to claim 8, comprising:
a circuit that generates the second control signals that are differentially supplied to the third differential transistor pair and the third control signals that are differentially supplied to the fourth differential transistor pair;
the second control signals turning on one transistor of the third differential transistor pair with an output thereof connected to the second output terminal and turning off the other transistor of the third differential transistor pair with an output thereof connected to the first power supply, when a positive-phase signal of the input signals transitions from a first value to a second value, and otherwise, turning off the one transistor of the third differential transistor pair with the output thereof connected to the second output terminal and turning on the transistor with the output thereof connected to the first power supply,
the third control signals turning on one transistor of the fourth differential transistor pair with an output thereof connected to the first output terminal and turning off the other transistor of the fourth differential transistor pair with an output thereof connected to the first power supply, when the positive-phase signal of the input signals transitions from the second value to the first value, and otherwise, turning off the one transistor of the fourth differential transistor pair with the output thereof connected to the first output terminal and turning on the other transistor with the output thereof connected to the first power supply.

10. The output circuit according to claim 9, wherein the first control signals comprises
a positive-phase signal and a negative-phase signal that is a complementary signal of the positive-phase signal,
the positive-phase signal being set to a first value when current bit data to be output has the first value and bit data immediately preceding the current bit data has a second value,
the positive-phase signal being set to the second value when the current bit data has the first value and the immediately preceding bit data has the first value,
the positive-phase signal being set to the second value when the current bit data has the second value and the immediately preceding bit data has the first value,
the positive-phase signal being set to the first value when the current bit data has the second value and the immediately preceding bit data has the second value.

11. The output circuit according to claim 8, wherein the first differential transistor pair comprises
first and second MOS transistors that respectively receive a positive-phase signal and a negative-phase signal of the input signals at gates thereof, drains of the first and second MOS transistors being respectively connected to the first and second output terminal, coupled sources of the first and second MOS transistors being connected to a drain of a ninth MOS transistor that forms the first current source,
wherein the second differential transistor pair comprises
third and fourth MOS transistors that respectively receive a positive-phase signal and a negative-phase signal of the first control signals at gates thereof, drains of the third and fourth MOS transistors being respectively connected to the first and second output terminals, coupled sources of the third and fourth MOS transistors being connected to a drain of a tenth MOS transistor that forms the second current source,
wherein the third differential transistor pair comprises
fifth and sixth MOS transistors that respectively receive a positive-phase signal and a negative-phase signal of the second control signals at gates thereof, drains of the fifth and sixth MOS transistors being respectively connected to the second output terminal and the first power supply, coupled sources of the fifth and sixth MOS transistors being connected to a drain of an eleventh MOS transistor that forms the third current source, and wherein the fourth differential transistor pair comprises
seventh and eighth MOS transistors that respectively receive a positive-phase signal and a negative-phase signal of the third control signals at gates thereof, drains of the seventh and eighth MOS transistors being respectively connected to the first power supply and the first output terminal, coupled sources of the seventh and eighth MOS transistors being connected to a drain of a twelfth MOS transistor that forms the fourth current source.

12. The output circuit according to claim 11, wherein at the time of the pre-emphasis responsive to a transition of the positive-phase signal of the input signals from a second value to a first value,
the first, third, sixth, and eighth MOS transistors are turned on, and
the second, fourth, fifth, and seventh MOS transistors are turned off;
at the time of the de-emphasis after the pre-emphasis,
the first, fourth, sixth, and seventh MOS transistors are turned on, and
the second, third, fifth, and eighth MOS transistors are turned off;
at the time of the pre-emphasis responsive to a transition of the positive-phase signal of the input signals from the first value to the second value,
the second, fourth, fifth, and seventh MOS transistors are turned on, and
the first, third, sixth, and eighth MOS transistors are turned off; and
at the time of the de-emphasis after the pre-emphasis,
the second, third, sixth, and seventh MOS transistors are turned on, and
the first, fourth, fifth, and eighth MOS transistors are turned off.

13. An output circuit comprising:
first and second input terminals;
first and second output terminals;
a first current source connected to a second power supply;
a first differential transistor pair driven by the first current source, the first differential transistor pair having an input pair connected to the first and second input terminals and having an output pair connected to the first and second output terminals;
a load resistor element pair connected between the first and second output terminals and a first power supply;
a second current source connected to the second power supply;
a second differential transistor pair driven by the second current source, the second differential transistor pair differentially receiving first control signals, the second differential transistor pair having an output pair connected to the first and second output terminals;
a third current source connected to the second power supply;
a third differential transistor pair driven by the third current source, the third differential transistor pair differentially receiving second control signals, the third differential transistor pair having an output pair connected to the second output terminal and the first power supply;
a fourth current source connected to the second power supply; and
a fourth differential transistor pair driven by the fourth current source, the fourth differential transistor pair differentially receiving third control signals, the fourth differential transistor pair having an output pair connected to the first power supply and the first output terminal.

14. The output circuit according to claim 13, comprising:
a circuit that generates the second control signals that are differentially supplied to the third differential transistor pair and the third control signals that are differentially supplied to the fourth differential transistor pair;
the second control signals turning on one transistor of the third differential transistor pair with an output thereof connected to the second output terminal and turning off the other transistor of the third differential transistor pair with an output thereof connected to the first power supply, when a positive-phase signal of the input signals transitions from a first value to a second value, and otherwise, turning off the one transistor of the third differential transistor pair with the output thereof connected to the second output terminal and turning on the transistor with the output thereof connected to the first power supply,
the third control signals turning on one transistor of the fourth differential transistor pair with an output thereof connected to the first output terminal and turning off the other transistor of the fourth differential transistor pair with an output thereof connected to the first power supply, when the positive-phase signal of the input signals transitions from the second value to the first value, and otherwise, turning off the one transistor of the fourth differential transistor pair with the output thereof connected to the first output terminal and turning on the other transistor with the output thereof connected to the first power supply.

15. The output circuit according to claim 14, wherein the first control signals comprise
a positive-phase signal and a negative-phase signal that is a complementary signal of the positive-phase signal,
the positive-phase signal being set to a first value when current bit data to be output has the first value and bit data immediately preceding the current bit data has a second value,
the positive-phase signal being set to the second value when the current bit data has the first value and the immediately preceding bit data has the first value,
the positive-phase signal being set to the second value when the current bit data has the second value and the immediately preceding bit data has the first value,
the positive-phase signal being set to the first value when the current bit data has the second value and the immediately preceding bit data has the second value.

16. The output circuit according to claim 13, wherein the first differential transistor pair comprises
first and second MOS transistors that respectively receive a positive-phase signal and a negative-phase signal of the input signals at gates thereof, drains of the first and second MOS transistors being respectively connected to the first and second output terminal, coupled sources of the first and second MOS transistors being connected to a drain of a ninth MOS transistor that forms the first current source,
wherein the second differential transistor pair comprises
third and fourth MOS transistors that respectively receive a positive-phase signal and a negative-phase signal of the first control signals at gates thereof, drains of the third and fourth MOS transistors being respectively connected to the first and second output terminals, coupled sources of the third and fourth MOS transistors being connected to a drain of a tenth MOS transistor that forms the second current source, wherein the third differential transistor pair comprises
fifth and sixth MOS transistors that respectively receive a positive-phase signal and a negative-phase signal of the second control signals at gates thereof, drains of the fifth and sixth MOS transistors being respectively connected to the second output terminal and the first power supply, coupled sources of the fifth and sixth MOS transistors being connected to a drain of an eleventh MOS transistor that forms the third current source, and
wherein the fourth differential transistor pair comprises seventh and eighth MOS transistors that respectively receive a positive-phase signal and a negative-phase signal of the third control signals at gates thereof, drains of the seventh and eighth MOS transistors being respectively connected to the first power supply and the first output terminal, coupled sources of the seventh and eighth MOS transistors being connected to a drain of a twelfth MOS transistor that forms the fourth current source.

17. The output circuit according to claim 16, wherein at the time of the pre-emphasis responsive to a transition of the positive-phase signal of the input signals from a second value to a first value,
the first, third, sixth, and eighth MOS transistors are turned on, and
the second, fourth, fifth, and seventh MOS transistors are turned off;
at the time of the de-emphasis after the pre-emphasis,
the first, fourth, sixth, and seventh MOS transistors are turned on, and
the second, third, fifth, and eighth MOS transistors are turned off;
at the time of the pre-emphasis responsive to a transition of the positive-phase signal of the input signals from the first value to the second value,
the second, fourth, fifth, and seventh MOS transistors are turned on, and
the first, third, sixth, and eighth MOS transistors are turned off; and
at the time of the de-emphasis after the pre-emphasis,
the second, third, sixth, and seventh MOS transistors are turned on, and
the first, fourth, fifth, and eighth MOS transistors are turned off.

18. An output circuit comprising:
first and second input terminals;
first and second output terminals;
a main buffer that receives differential input signals from the first and second input terminals and outputs differential output signals to the first and second output terminals;
a pre-emphasis buffer that applies pre-emphasis to the differential output signals at a transition bit of the differential input signals; and
a de-emphasis-level control buffer comprising a differential circuit that operates to reduce a current value during a de-emphasis bit and not during the transition bit.

19. The output circuit according to claim 18, wherein the differential circuit comprises two differential pairs of transistors that operate to reduce the current value only during the de-emphasis bit, such that a level of a common mode voltage is raised.

20. The output circuit according to claim 18, wherein the differential circuit comprises two differential pairs of transistors that operate to reduce the current value only with the de-emphasis bit providing a time of de-emphasis, such that a level of a common mode voltage of the de-emphasis bit is comparable to a level of a common mode voltage of the transition bit.

* * * * *